United States Patent [19]

Sill

[11] 4,140,544
[45] Feb. 20, 1979

[54] DIVERGENT LUMINESCENT COLLECTOR FOR PHOTOVOLTAIC DEVICE

[75] Inventor: Richard C. Sill, Reno, Nev.

[73] Assignee: Atlantic Richfield Company, Los Angeles, Calif.

[21] Appl. No.: 912,284

[22] Filed: Jun. 5, 1978

[51] Int. Cl.$^2$ .......................................... H01L 31/04
[52] U.S. Cl. ............................. 136/89 PC; 250/227
[58] Field of Search ................ 136/89 PC, 89 HY; 250/227, 361 R, 367, 458, 460, 486–488; 350/96.1

[56] References Cited

U.S. PATENT DOCUMENTS

| | | | |
|---|---|---|---|
| 2,765,411 | 10/1956 | Kerr | 250/71 |
| 3,541,374 | 11/1970 | Lidoski et al. | 313/108 |
| 4,110,123 | 8/1978 | Goetzberger et al. | 136/89 PC |
| 4,116,718 | 9/1978 | Yerkes et al. | 136/89 PC |

FOREIGN PATENT DOCUMENTS

| | | | |
|---|---|---|---|
| 2501907 | 7/1976 | Fed. Rep. of Germany | 136/89 |
| 2620115 | 11/1977 | Fed. Rep. of Germany | 136/89 |

OTHER PUBLICATIONS

A. Goetzberger et al., "Solar Energy Conversion with Fluorescent Collectors", Appl. Phys., vol. 14, pp. 123-139 (1977).

*Primary Examiner*—Aaron Weisstuch
*Attorney, Agent, or Firm*—M. David Folzenlogen

[57] ABSTRACT

In the photovoltaic conversion of solar radiation to electrical energy, light energy passes through an upper or outer surface of a collector member where the light energy is absorbed and reradiated by luminescent materials in the collector. Internal light energy strikes the upper surface and a lower surface of the collector until it is emitted at an edge surface of the collector into a photovoltaic cell mounted on the edge surface. The upper and lower surfaces of the collector are divergent in one or more preselected directions. This divergence changes the internal angle of reflection and directs the light energy to the edge surface and photovoltaic cell thereby decreasing loss of useful energy from within the collector. Light emissive areas of the edge and lower surfaces not covered by a photovoltaic cell may also be covered by a reflective material. The reflective material may be a diffusive material.

16 Claims, 4 Drawing Figures

U.S. Patent     Feb. 20, 1979     4,140,544
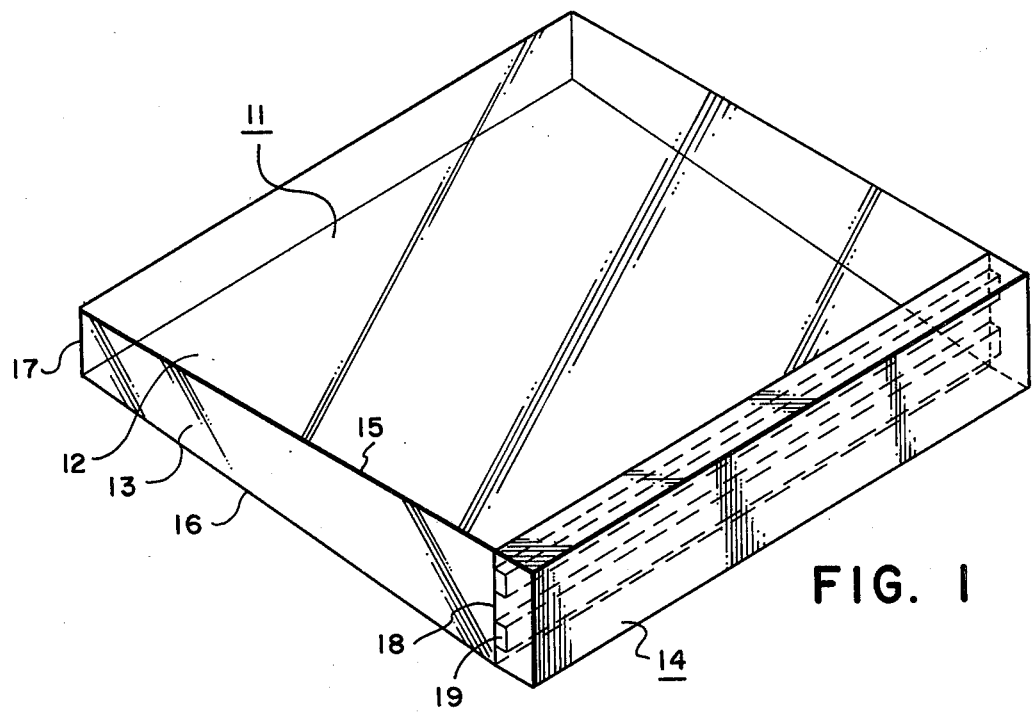
FIG. 1
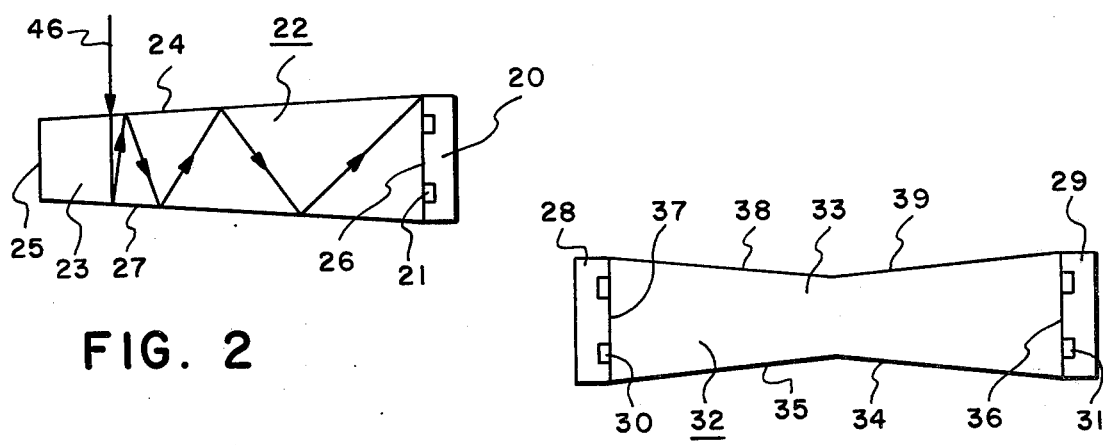
FIG. 2
FIG. 3
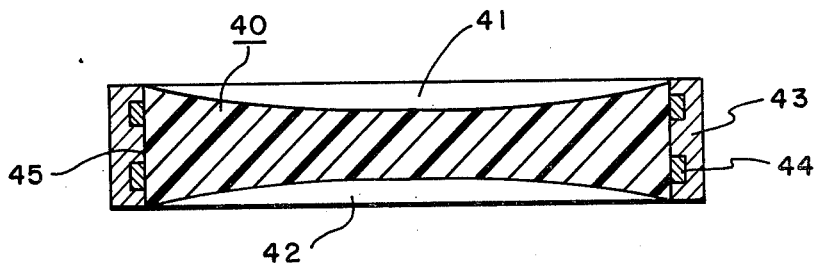
FIG. 4

DIVERGENT LUMINESCENT COLLECTOR FOR PHOTOVOLTAIC DEVICE

BACKGROUND OF THE INVENTION

This invention pertains to a photovoltaic device having a luminescent collector with divergent surfaces and edge mounted cells, thereby changing the internal surface angle of reflection of collected light energy.

It has been proposed, in for example, APPLIED OPTICS, Volume 15, No. 10, Pages 2299-2300, October 1976, the disclosure of which is incorporated herein by reference, to convert solar radiation to electrical energy with a solar cell comprised of a planar sheet of luminescent medium with edge coupled semiconductor photocells. The collector is a sheet of material having parallel upper and lower surfaces. Solar radiation enters the collector through the upper surface. Both the upper and the bottom surface of the collector are kept free of absorptive or nonreflective substances so that internally the surfaces tend to reflect collected light energy but light energy striking either of these surfaces at the appropriate angle may escape from the collector. The collector uses luminescent dyes or materials which tend to absorb light energy in a portion of the solar spectrum. The luminescent materials reradiate the absorbed light energy at a better wavelength or energy form for conversion to electricity by a solar cell. The luminescent materials also radiate the absorbed light energy at an angle which facilitates reflection of the emitted light energy at the surfaces of the collector. Much of the useful light energy is thus trapped in the collector and propagates by successive reflections to the edges of the collector where the light energy is emitted into a photovoltaic cell.

Some of the collected light energy tends to be lost from the collector by successive reflections at the upper or lower surface. To enhance the captured properties of the collector, it has been proposed to coat or cover the bottom surface of the collector with a mirror-like coating. In addition, it has been proposed to use a protective or filtering layer ahead of the upper surface of the collector.

Luminescent materials are selected for their absorption properties, luminescent efficiency, and transmittance in the emission region. Useful light energy is lost whenever some of the light is not reflected by the upper or lower surface. It is postulated that other losses may be caused when the reradiated energy repeatedly contacts the luminescent materials, for example, as by attenuation and by conversion of useful light energy to unuseable wavelengths.

SUMMARY OF THE INVENTION

This invention pertains to a luminescent photovoltaic device for converting solar or other light radiation to electrical energy. The device has a luminescent collector member with divergent upper and lower surfaces. These surfaces are divergent in at least that part or area of the collector where solar radiation enters the collector. The direction of the divergence is selected to direct the internal surface angle of reflection of collected light energy toward one or more photovoltaic cells mounted on or coupled to one or more edge surfaces of the collector. The angle of divergence is such that the maximum thickness of the collector in the area of divergence is at least one percent thicker than the thickness at the point of start of divergence. At this angle and direction, the divergently sloping lower surface or lower and upper surfaces tend to reduce the number of internal light reflections and the path travelled by the light in reaching the photovoltaic cell.

Normally, photovoltaic cells will be mounted on only one edge surface and only one direction of divergence will be used, but cells may be mounted on two or more edge surfaces, for example, on opposite edge surfaces. In this case, the divergence will start near the center of the collector and the divergence will be at the appropriate angle in two directions, one toward one edge surface and one toward the opposite edge surface. By the same token, the divergence could be in all directions from the center of the collector when cells are mounted around the entire collector.

In some embodiments, the open edge surfaces not covered by cells and the lower surface are covered with a suitable reflective material. The preferred reflective material is a reflective diffusive material.

BRIEF DESCRIPTION OF THE DRAWINGS

FIG. 1 is an isometric view of a photovoltaic device having a level upper surface and a divergent lower surface sloping in one direction toward one edge mounted photovoltaic cell. For illustrative purposes, the vertical scale is exaggerated.

FIG. 2 is an end view of a photovoltaic device having divergent upper and lower surfaces sloping in one direction toward an edge mounted photovoltaic cell. Also depicted is the shortened path of a light beam reflecting between these surfaces.

FIG. 3 is an end view of a photovoltaic device having divergent upper and lower surfaces sloping in two directions toward edge mounnted photovoltaic cells.

FIG. 4 is a cross-sectional view of a circular photovoltaic device having concave upper and lower surfaces sloping outwardly toward edge mounted photovoltaic cells.

DETAILED DESCRIPTION

This invention relates to a photovoltaic device or solar cell for converting solar or other forms of light radiation to electrical energy. As shown in FIG. 1, the device has luminescent collector member 11. The collector member may be made of one or more layers of material containing one or more luminescent materials, such as, for example, phosphorescent, fluorescent, or similar substances, dyes or agents, which absorb at least a portion of the light energy entering the collector and reradiate or emit the abosrbed light. Luminescent materials are well known. For example, the luminescent material may be an organic dye of the type used in lasers and scintillation counters. Luminescent substances are chosen for the wavelength of the light they absorb and the wavelength of the light they reradiate, their luminescent efficiency and transmittance in the wavelength region of the reradiated light. The reradiated light has increased intensity in a wavelength more suitable for electrical conversion by the type of photovoltaic cell being used. For example, presently used silicon photovoltaic cells peak in a wavelength range of 0.5 to 1.1 micrometers. Several luminescent agents may be incorporated to produce a cascading absorption-reradiation effect. The amount and types of luminescent materials used will, therefore, vary depending upon the type of photovoltaic cell or cells used, the use of the photovoltaic device, the type of light radiation, and the like. The function is as described and one skilled in the photovoltaic art can choose the appropriate materials. The luminescent agents can include pigments, metals or oxides or other compoounds of the metals such as neodymium oxide employed in a glass matrix or one or more laser dyes such as the coumarin family of dyes and the rhodamine family of dyes. These dyes are very complex chemically, e.g., coumarin 102 is 2,3,5,6-1H,4H-tetrahydro-8-methylquinolazino-[9,9a,1-gh] coumarin, and rhodamine 110 is o-(6-amino-3-imino-3H-xanthen-9-yl) benzoic acid hydrochloride.

A typical collector member will be made of a normally transparent material impregnated or infused during manufacture with one or more luminescent materials designed to collect and change the wavelength and/or the direction of light radiation energy. The typical collector will be a sheet-like member with luminescent materials dispersed therein that is either used as is or that is shaped to an appropriate configuration. The base collector material may be a conventional polymeric material such as polymethylmethacrylate, other known acrylic polymers, styrene polymers, and the like. The collector material can also be a glass or other transparent material into which the luminescent materials may be incorporated and which, like the polymeric material, are non-deleterious to such agents and to the photovoltaic cells, and which can be formed into a divergent structural shape. The collector material may be the type of light transmitting materials heretofore used to cover conventional non-luminescent photovoltaic devices.

Collector member 11 has upper surface 12 to a substantial area into which solar radiation is to impinge. As shown in FIG. 1, upper surface 12 has length and width and is level or flat. The collector member has four edge surfaces. In FIG. 1, only edge surface 13 is visible. Two of the edge surfaces are hidden from view. The fourth edge surface is covered by at least one photovoltaic cell 14 which will be hereinafter described in more detail.

Collector member 11 has a bottom surface which is also hidden from view. Edge surface 13 is, therefore, bounded on its top side by top edge 15 where the edge surface and upper surface 12 meet, on its bottom side by bottom edge 16 where the edge surface and the bottom surface meet, rear edge 17 where the edge surface meets a rear hidden edge surface, and front edge 18 where the edge surface meets the edge surface to which photovoltaic cell 14 is coupled.

It is to be particularly noted that bottom edge 16 slopes downwardly from rear edge 17 toward front edge 18 and that the bottom surface follows the slope of bottom edge 16. In other words, starting at rear edge 17, the bottom surface diverges away from upper surface 12 in at least one direction toward the edge surface on which photovoltaic cell 14 is mounted. As shown, rear edge 17 relates to the minimum thickness of the collector member and to the thickness of the collector member at the point where the bottom or lower surface starts diverging or sloping away from upper surface 12. Front edge 18 relates to the maximum thickness of the collector member. The maximum thickness of collector member 11 must be at least one percent thicker than the thickness of the collector member at point of start of divergence of the bottom or lower surface. In other words, as shown, front edge 18 is at least one percent longer than rear edge 17. When the bottom surface slopes toward the photovoltaic cell at an angle sufficient to thicken the collector by at least one percent of the minimum thickness, the slope of the lower surface, or the lower and upper surfaces as hereinafter described, will be sufficient to change the internal angle of reflection and to direct light energy in a shortened path to the photovoltaic cell. If desired, the lower surface could be level and the upper surface made to diverge from the lower surface in the manner just described.

Photovoltaic cell 14 may be of any size, shape, or configuration for optic coupling or mounting on an edge surface of the collector member and made of any appropriate cell material. Herein reference is made to silicon cells because they are the most commonly used cells, but the present invention is applicable to cells using other substances, such as, germanium, indium phosphide, gallium antimonide, cadmium sulfide, cadmium selenide, cadmium telluride, zinc oxide, zinc sulfide, zinc selenide, copper sulfide, cupric oxide, titanium dioxide, aluminum arsenide, aluminum gallium arsenide, selenium, gallium phosphide, combinations thereof, and the like. The manufacture of such cells, p-n junnction, and electrical contacts and connectors 19 is well known.

One or more photovoltaic cells 14 are coupled to or mounted on one or more edge surfaces of collector member 11 in any conventional manner such as with a moisture barrier, glue, silicone, polyvinylbutyrate, etc., which hold the cell or cells in place.

In FIG. 2, there is shown an end view of a photovoltaic device having photovoltaic cell 20, contacts 21, and collector member 22 with edge surface 23, all having characteristics similar to those previously described in relation to FIG. 1 except that the outer or upper surface follows the slope of top edge 24 which slopes upward in one direction from left edge 25 toward right edge 26 and photovoltaic cell 20. The upper surface thereby diverges away from the lower surface which follows the slope of lower edge 27. As previously discussed, right edge 26 relates to the maximum thickness of collector member 22 in the area of divergence and left edge 25 relates to the thickness of the collector at the point of start of divergence. This maximum thickness is at least one percent thicker than this minimum thickness.

A collector member having upper and lower surfaces divergent in two directions is illustrated in FIG. 3 wherein the photovoltaic cells 28 and 29, contacts 30 and 31, collector member 32 and edge surface 33 have the basic characteristics previously described. The inner or lower surface of collector member 32 follows the double slope of lower edges 34 and 35. Starting at the center of the collector member which is in the area of the collector where solar energy enters the collector, lower edge 34 slopes downward toward right edge 36 and photovoltaic cell 29, and lower edge 35 slopes downward toward left edge 37 and photovoltaic cell 28. The collector member, therefore, has a minimum thickness near the center area of the collector. In at least this area, the lower surface of the collector member, therefore, diverges away from the upper surface in two directions, that is, in one direction toward photovoltaic cell 28 and in one direction toward photovoltaic cell 29. The cells are mounted on opposite edge surfaces of the collector member and the thickness of collector member at left edge 37 and right edge 36 is at least one percent thicker than the minimum thickness near the center of the collector.

As illustrated in FIG. 3, the upper surface of collector member 32 follows the slope of upper edges 38 and 39. Starting at the center of the collector member, upper edge 38 slopes outward or upward toward left edge 37 and photovoltaic cell 28, and upper edge 39 slopes outward or upward toward right edge 36 and photovoltaic cell 29. The outer or upper surface of the collector member, therefore, diverges from the lower surface in two directions, that is, in one direction toward photovoltaic cell 28 and in one direction toward photovoltaic cell 29.

In FIG. 4, there is illustrated circular collector member 40 which has concave upper surface 41 and concave lower surface 42 which diverge in all directions away from the center of the collector toward one or more photovoltaic cells 43 which have electrical contacts 44 and are mounted about the circumferential edge surface of the collector member. As previously described, the thickness of the collector member at edge 45 is at least one percent thicker than the thickness of the center of the collector member.

In operation, the upper, lower and edge surfaces of the collector member may be enclosed in appropriate protectors or mounting brackets. The surfaces of the luminescent member will be kept clear of absorptive impurities except for the photovoltaic cells. Since a luminescent member tends to funnel the useful light energy to the edge surfaces, it may be desirable to cover all of the light emissive areas of the lower surface and edge surfaces except those areas on which a photovoltaic cell is mounted with reflective or mirror-like material, e.g., polished silver, tin, aluminum, reflective paints, or a diffusive material that tends to break up incident light to maximize the opportunity for internal reflection, and the like. The collector may be used in any position. For descriptive purposes, the word upper has been used to describe the surface through which the light or solar radiation enters the collector. The word divergent has been used to describe a surface that slopes away from the opposite surface or away from a center axis of the collector, thereby increasing the thickness of the collector in the area of divergence. The angle or degree of divergence need not be constant but it usually will be.

The effect of the divergent lower surface, or the upper and lower surfaces, on light rays is shown in FIG. 2. For this purpose, the effect of the luminescent materials in the collector and the effect of a change in refractive index on the light beam are ignored. Total internal reflection is sought for whenever internal reflection occurs. As shown, light beam 46 enters the collector through upper surface 24. When the light beam strikes lower surface 27, it is internally reflected by this divergent lowerr surface toward photovoltaic cell 20 and at an angle greater than would have been the case if the lower surface had not been divergent. The reflected beam bounces back and forth between the sloping upper surface and sloping lower surface at ever increasing angles toward the photovoltaic cell until it strikes the edge surface where the photovoltaic cell is coupled. The divergence or nonparallelism of the surface or surfaces thereby produces a preferential energy flux toward the larger edge surface and hence to a photovoltaic cell. The beam leaves the collector whenever it strikes a surface where the cell is.

Reasonable variations and modifications are possible within the scope of this disclosure without departing from the spirit and scope of this invention.

The embodiments of the invention in which an exclusive property or privilege is claimed are defined as follows:

1. A photovoltaic device for converting solar radiation to electrical energy comprising a luminescent collector member having length, width and thickness, an upper surface having a substantial area onto which solar radiation is to be impinged and a lower surface; said upper surface and said lower surface having edges, said collector member having at least one edge surface between said edge of said upper surface from said edge of said lower surface, at least one photovoltaic cell mounted on at least a portion of said edge surface, said at least one photovoltaic cell being adapted to receive and convert to electrical energy solar radiation energy emitted at said portion of said edge surface into said at least one photovoltaic cell when solar radiation passes through said upper surface into said collector, said collector member being further characterized by the fact that in said radiation impinging area, at least one of said upper and lower surfaces diverges from the other in at least one direction, said direction of divergence being toward at least one photovoltaic cell mounted on an edge surface of said collector member, and the maximum thickness of said collector member in the area of divergence being at least one percent thicker than the thickness of said collector member at the point of start of divergence of said lower surface from said upper surface.

2. The photovoltaic device of claim 1 wherein a reflective material covers a major portion of the light emissive areas of said edge surfaces and said lower surface except those areas on which said at least one photovoltaic cell is mounted.

3. The photovoltaic device of claim 1 wherein in said radiation impinging area, said lower surface diverges from said upper surface in said at least one direction.

4. The photovoltaic device of claim 3 wherein a reflective material covers a major portion of the light emissive areas of said edge surfaces and said lower surface except those areas on which said at least one photovoltaic cell is mounted.

5. The photovoltaic device of claim 3 wherein in addition to the divergence of said lower surface, in said radiation impinging area, said upper surface diverges from said lower surface in said at least one direction.

6. The photovoltaic device of claim 5 wherein a reflective material covers a major portion of the light emissive areas of said edge surfaces and said lower surface except those areas on which said at least one photovoltaic cell is mounted.

7. The photovoltaic device of claim 1 wherein in said radiation impinging area, said upper surface diverges from said lower surface in said at least one direction.

8. The photovoltaic device of claim 7 wherein a reflective material covers a major portion of the light emissive areas of said edge surfaces and said lower surface except those areas on which said at least one photovoltaic cell is mounted.

9. The photovoltaic device of claim 1 wherein said collector member has a first and a second edge surface, said first and said second edge surfaces being located at opposite sides of said collector member, at least one photovoltaic cell being mounted on at least a portion of said first edge surface, at least one photovoltaic cell being mounted on at least a portion of said second edge surface, said collector member having a minimum thickness near the center area of said upper surface, in said radiation impinging area, at least one of said upper and said lower surfaces being divergent from the other of said surfaces starting near said center of said area in a first and a second direction, said first direction beinng toward said at least one photovoltaic cell mounted on said first edge surface, and said second direction being toward said at least one photovoltaic cell mounted on said second edge surface.

10. The photovoltaic device of claim 9 wherein a reflective material covers a major portion of the light emissive areas of said edge surfaces and said lower surface except those areas on which said at least one photovoltaic cell is mounted.

11. The photovoltaic device of claim 9 wherein in said radiation impinging area, said lower surface diverges from said upper surface starting near said center of said area in said first and said second directions.

12. The photovoltaic device of claim 11 wherein a reflective material covers a major portion of the light emissive areas of said edge surfaces and said lower surface except those areas on which said at least one photovoltaic cell is mounted.

13. The photovoltaic device of claim 11 wherein in addition to the divergence of said lower surface, in said radiatiom impinging area, said upper surface diverges away from said lower surface in said first and said second directions.

14. The photovoltaic device of claim 13 wherein a reflective material covers a major portion of the light emissive areas of said edge surfaces and said lower surface except those areas on which said at least one photovoltaic cell is mounted.

15. The photovoltaic device of claim 9 wherein in said radiation impinging area, said upper surface diverges from said lower surface starting near said center of said area in said first and said second directions.

16. The photovoltaic device of claim 15 wherein a reflective material covers a major portion of the light emissive areas of said edge surfaces and said lower surface except those areas on which said at least one photovoltaic cell is mounted.

* * * * *